(12) United States Patent
Cho et al.

(10) Patent No.: US 7,682,885 B2
(45) Date of Patent: Mar. 23, 2010

(54) METHOD FOR FABRICATING VERTICAL CHANNEL TRANSISTOR IN A SEMICONDUCTOR DEVICE

(75) Inventors: Jun-Hee Cho, Gyeonggi-do (KR); Sang-Hoon Park, Gyeonggi-do (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 12/164,867

(22) Filed: Jun. 30, 2008

(65) Prior Publication Data
US 2009/0163000 A1 Jun. 25, 2009

(30) Foreign Application Priority Data
Dec. 21, 2007 (KR) .................. 10-2007-0135187

(51) Int. Cl.
*H01L 21/84* (2006.01)
*H01L 21/00* (2006.01)
(52) U.S. Cl. .............. 438/156; 438/212; 438/268; 438/269; 438/492; 438/493; 257/E21.002

(58) Field of Classification Search .............. None
See application file for complete search history.

(56) References Cited

U.S. PATENT DOCUMENTS

| 5,324,673 | A  | * | 6/1994  | Fitch et al. | 438/156 |
| 6,426,259 | B1 | * | 7/2002  | Yu           | 438/269 |
| 6,660,590 | B2 | * | 12/2003 | Yoo          | 438/268 |
| 7,241,655 | B2 | * | 7/2007  | Tang et al.  | 438/212 |

* cited by examiner

*Primary Examiner*—Zandra Smith
*Assistant Examiner*—Khanh B. Duong
(74) *Attorney, Agent, or Firm*—Lowe Hauptman Ham & Berner LLP

(57) ABSTRACT

A method for fabricating a semiconductor device includes forming a sacrificial layer over a substrate, forming a contact hole in the sacrificial layer, forming a pillar to fill the contact hole. The pillar laterally extends up to a surface of the sacrificial layer and then the sacrificial layer is removed. The method further includes forming a gate dielectric layer over an exposed sidewall of the pillar, and forming a gate electrode over the gate dielectric layer. The gate electrode surrounds the sidewall of the pillar.

25 Claims, 5 Drawing Sheets

METHOD FOR FABRICATING VERTICAL CHANNEL TRANSISTOR IN A SEMICONDUCTOR DEVICE

CROSS-REFERENCE TO RELATED APPLICATIONS

The present application is based on, and claims priority from, Korean patent application number 10-2007-0135187, filed on Dec. 21, 2007, the disclosure of which is incorporated by reference herein its entirety.

BACKGROUND OF THE INVENTION

The disclosed embodiments relate to a method for fabricating a semiconductor device, and more particularly, to a method for fabricating a vertical channel transistor.

As dynamic random access memory (DRAM) devices are becoming highly integrated, a feature size is getting smaller and doping concentration to a substrate is gradually increasing. Such a high integration of the device inevitably leads to a junction leakage, a short channel effect, etc., and thus a typical planar transistor is not suitable for a highly integrated device. Further, a channel length and width are limited and electron mobility decreases due to an increase in channel doping concentration, therefore, it is difficult to ensure channel current sufficiently. To overcome the limitation of the typical planar transistor, a vertical channel transistor has been proposed.

FIG. 1 illustrates a cross-sectional view of a typical vertical channel transistor.

Referring to FIG. 1, the typical vertical channel transistor includes a pillar having a body pillar 12 and a head pillar 13 which are obtained by etching a silicon substrate 11, a gate dielectric layer 14 formed over a surface of the body pillar 12, and a surround type gate electrode 15 formed over the gate dielectric layer 14 and surrounding an outer wall of the body pillar 12. A hard mask layer 16 is formed over the head pillar 13, and a capping layer 17 is formed on sidewalls of the head pillar 13 and the hard mask layer 16.

In the typical vertical channel transistor of FIG. 1, the body pillar 12 surrounded by the gate electrode 15 serves as a channel so that the channel is vertically formed. However, in the fabrication of the typical vertical channel transistor, there is difficulty in forming patterns, particularly forming a channel which is most important in a transistor. It is also estimated that there is difficulty in performing a lateral etch for forming a pillar to be used as a vertical channel transistor.

The body pillar 12 is typically formed by a lateral etching such as an isotropic dry etching. Hence, a width of the body pillar 12 may not be easily adjusted, leading to the formation of a pillar with a non-uniform linewidth. Further, if the width of the body pillar 12 is small, the pillar may collapse. Since the pillar is formed through etching process in the typical vertical channel transistor, it is difficult to perform a pillar forming process, thus reducing reliability of the vertical channel transistor.

SUMMARY OF THE INVENTION

In essence, the embodiments of the present invention contemplate a method for fabricating a vertical channel transistor, which can stably form a pillar serving as a vertical channel without the use of an etching process.

Further, the embodiments of the present invention also contemplate a method for fabricating a semiconductor device having a uniform linewidth for each wafer lot.

In accordance with the embodiments of the present invention, a method for fabricating a semiconductor device includes, forming a sacrificial layer over a substrate, forming a contact hole in the sacrificial layer, forming a pillar filling the contact hole. The pillar extends up to and above a top surface of the sacrificial layer and then, the sacrificial layer is removed. Further, the method includes, forming a gate dielectric layer over an exposed sidewall of the pillar, and forming a gate electrode over the gate dielectric layer. The gate electrode surrounds a sidewall of the pillar.

Further, in accordance with the embodiments of the present invention, a method for fabricating a pillar of a semiconductor device includes forming a sacrificial layer over a substrate, forming a contact hole in the sacrificial layer, forming a body pillar filling the contact hole, forming a head pillar on the body pillar. The head pillar laterally extends above a surface of the sacrificial layer, and then the sacrificial layer is removed.

DETAILED DESCRIPTION OF DISCLOSED EMBODIMENTS

In the following detailed description, for purposes of explanation, numerous specific details are set forth in order to provide a thorough understanding of the present invention. It will be apparent, however, that the present invention may be practiced without these specific details.

Further, it will be understood that when an element such as a layer, a film, a pattern and a region is referred to as being 'on/under' another element herein, it may be directly on/under the other element, and one or more intervening elements may also be present.

Hereinafter, a method for fabricating a vertical channel transistor in accordance with the present invention will be described in detail with reference to the accompanying drawings. In descriptions below, a pillar used as a vertical channel transistor is formed through a silicon growth technique instead of an etching process. A contact hole is formed in a region where a channel will be formed, and silicon growth is performed through an epitaxial growth technique such as a solid phase epitaxy (SPE) and a silicon epitaxy growth (SEG).

FIGS. 2A to 2G illustrate a method for fabricating a vertical channel transistor in accordance with an embodiment of the present invention.

Figure 1:
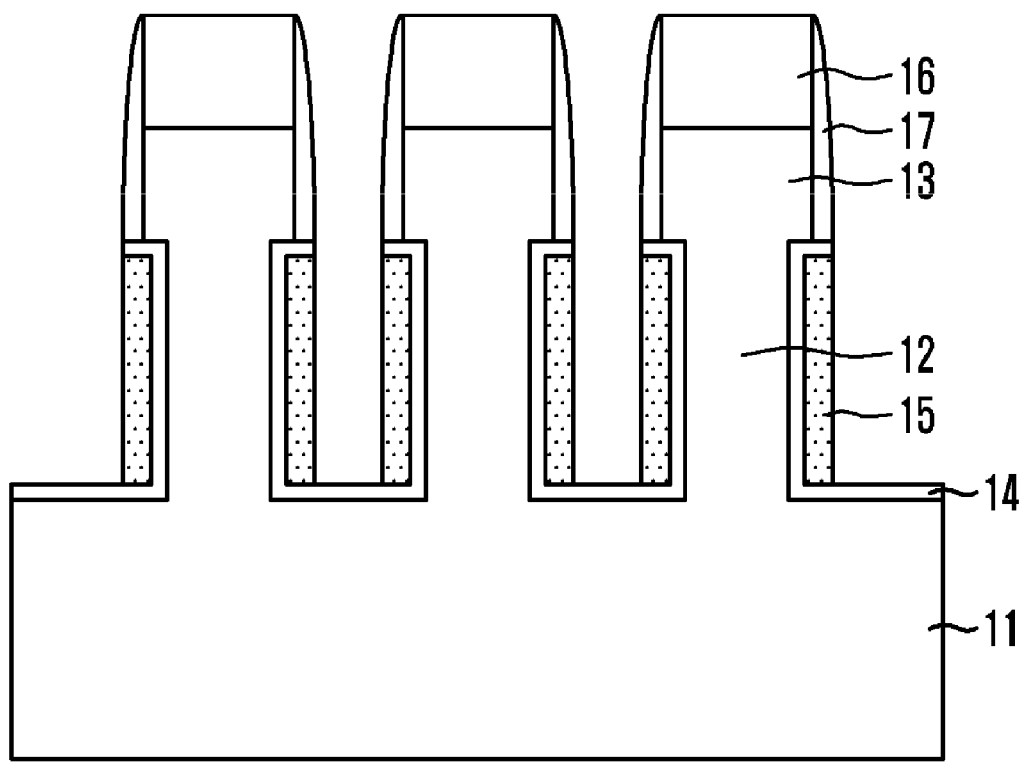
FIG. 1 illustrates a cross-sectional view of a typical vertical channel transistor.
Figure 2A:
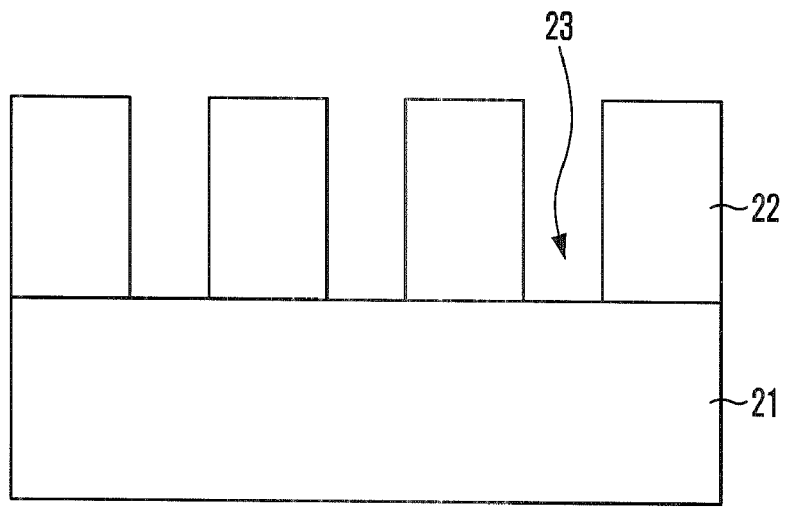
FIGS. 2A to 2G illustrate a method for fabricating a vertical channel transistor in accordance with an embodiment of the present invention.

Referring to FIG. 2A, a sacrificial layer (not shown) is formed on a silicon substrate 21, wherein the silicon substrate 21 may have an ion implanted region needed for operation of the device. The sacrificial layer is formed of an insulation material such as oxide and nitride. The sacrificial layer is formed to a thickness ranging from approximately 2,000 Å to approximately 3,000 Å.

The sacrificial layer is etched using a photoresist pattern (not shown) to form a sacrificial layer pattern 22 and a contact hole 23 exposing a surface of the silicon substrate 21. It is within the scope of the invention to provide the contact hole 23 with a circular shape in plan view.

Figure 2B:
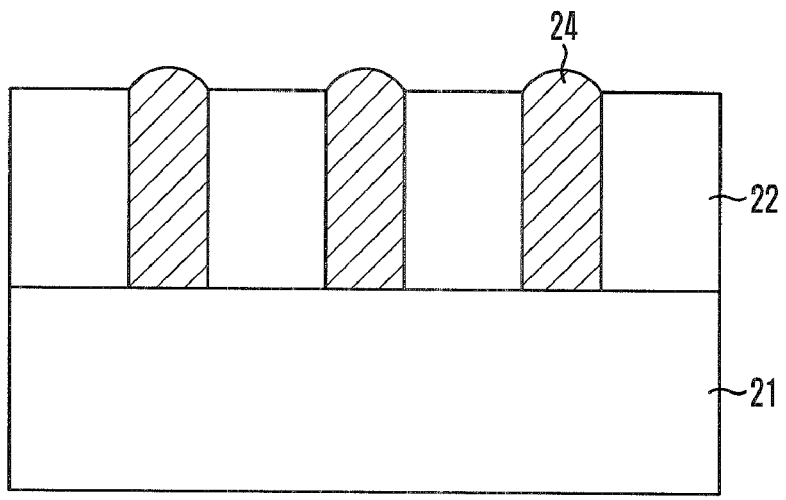

Referring to FIG. 2B, a first single crystal silicon layer 24 is grown on the surface of the silicon substrate 21 exposed by the contact hole 23. The first single crystal silicon layer 24 is grown through an epitaxial growth technique such as solid phase epitaxy (SPE) and silicon epitaxy growth (SEG) until the first single crystal silicon layer 24 completely fills the contact hole 23.

Figure 2C:
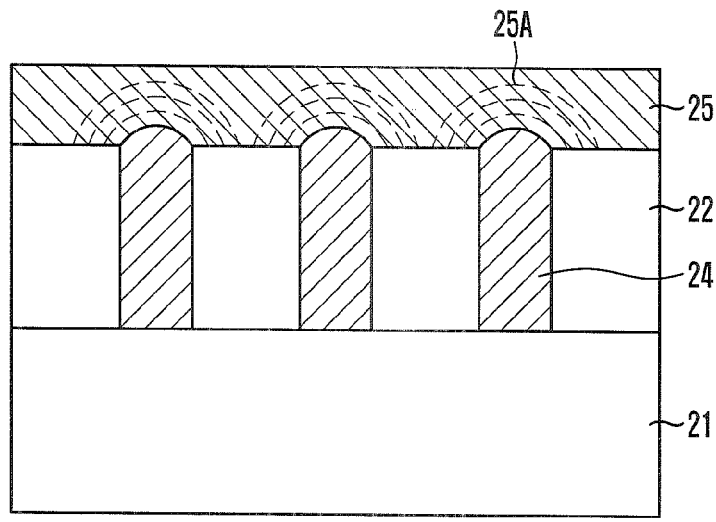

Referring to FIG. 2C, a second single crystal silicon layer 25 is grown on the first single crystal silicon layer 24. The second single crystal silicon layer 25 is grown through an epitaxial growth technique such as solid phase epitaxy (SPE) and silicon epitaxy growth (SEG). An epitaxial lateral overgrowth (ELO) 25A is performed to allow the second single crystal silicon layer 25 to be laterally grown above a top surface of the sacrificial layer pattern 22.

For example, the second single crystal silicon layer 25 has a thickness ranging from approximately 1,000 Å to approximately 1,500 Å from the top surface of the sacrificial layer pattern 22. The second single crystal silicon layer 25 can be planarized through a planarization process such as chemical mechanical polishing (CMP).

Figure 2D:
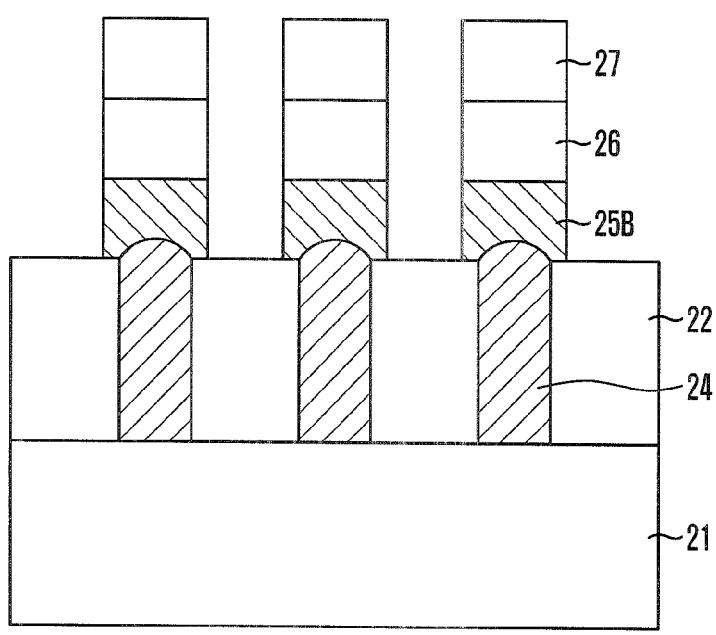

Referring to FIG. 2D, a hard mask layer (not shown) is formed on the second single crystal silicon layer 25. The hard mask layer may be formed of silicon nitride ($Si_3N_4$) or silicon carbide (SiC). The hard mask layer may be formed to approximately 2,000 Å thick.

A photoresist pattern 27 for isolation is formed on the hard mask layer, and the hard mask layer and the second single crystal silicon layer 25 are sequentially etched using the photoresist pattern 27. Here, an anti-reflective layer (not shown) may be formed under the photoresist pattern 27 to prevent scattered reflection. An organic-based anti-reflective layer is used as the anti-reflective layer. The photoresist pattern 27 may be formed of cycloolefin maleic anhydride (COMA) or acrylate-based polymer.

The second single crystal silicon layer 25 is etched to form a head pillar 25B, and a hard mask pattern 26 remains on the head pillar 25B. The second single crystal silicon layer 25 is etched through dry etching.

As will be described below, the first single crystal silicon layer 24 under the head pillar 25B will serve as a body pillar. As a result, a pillar including the head pillar 25B and the body pillar will be obtained. The head pillar 25B has a circular shape, and the width of the head pillar 25B is greater than the body pillar. It is also within the scope of the invention to provide the photoresist pattern 27 with a circular shape of which the width is greater than that of the contact hole 23.

Figure 2E:
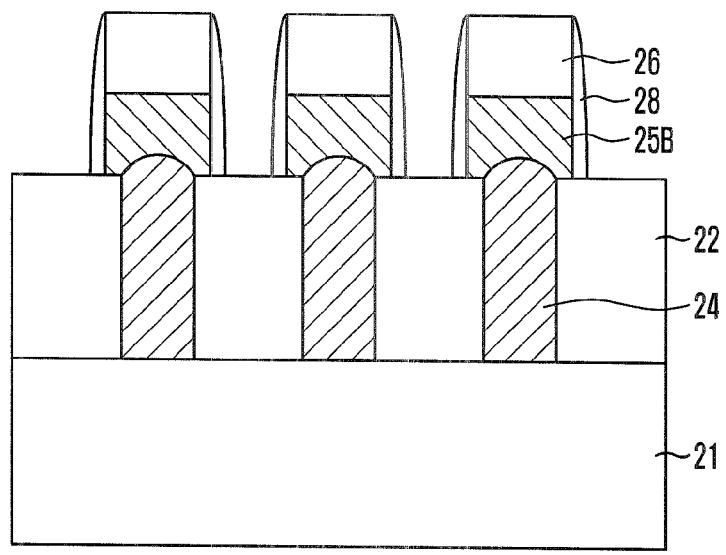

Referring to FIG. 2E, the photoresist pattern 27 is removed, and a capping layer 28 is formed over a resultant structure. The capping layer 28 may be formed by using a nitride layer solely or by forming an oxide layer and a nitride layer in sequence. The nitride layer may include a silicon nitride ($Si_3N_4$) layer. A straight etching, e.g., etchback, is performed to leave the capping layer 28 on a sidewall of the head pillar 25B, and to expose a surface of the sacrificial layer pattern 22 between the head pillars 25B. Here, the capping layer 28 also remains on a sidewall of the hard mask pattern 26. The capping layer 28 protects the sidewall of the head pillar 25B during a subsequent process. For example, the capping layer 28 may be formed to a thickness ranging approximately 50 Å to approximately 100 Å.

Figure 2F:
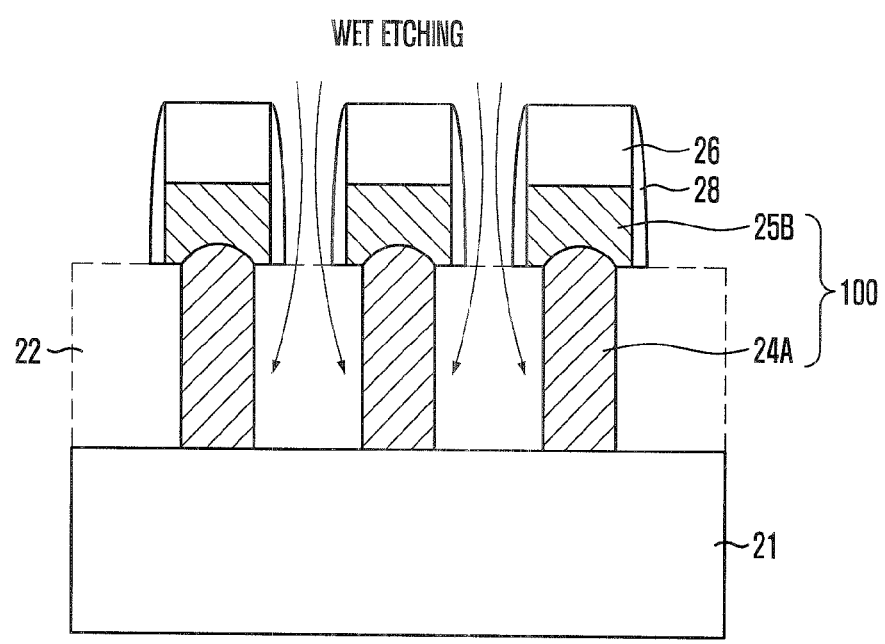

Referring to FIG. 2F, the sacrificial layer pattern 22 is completely removed to form a body pillar 24A made from the first single crystal silicon layer 24. The removal of the sacrificial layer pattern 22 is performed using wet etching. Specifically, the sacrificial layer pattern 22 is removed using a solution containing hydrofluoric (HF) acid if the sacrificial layer pattern 22 is formed of an oxide, and the sacrificial layer pattern 22 is removed using a solution containing phosphoric acid if the sacrificial layer pattern 22 is formed of a nitride. When the sacrificial layer pattern 22 is formed of an oxide, the hard mask pattern 26 and the capping layer 28 are formed of a nitride. When the sacrificial layer pattern 22 is formed of a nitride, the hard mask pattern 26 and the capping layer 28 are formed of a material having an etch selectivity to the nitride during wet etching. The embodiment may include the sacrificial layer pattern 22 being formed of an oxide, and the hard mask pattern 26 and the capping layer 28 being formed of a nitride. Thus, the hard mask pattern 26 and the capping layer 28 are not removed during the wet etching performed for removing the sacrificial layer pattern 22, and therefore, the head pillar 25B and the body pillar 24A are not damaged by the wet etching.

After the sacrificial layer pattern 22 is completely removed, the first single crystal silicon layer 24 and a portion of the substrate 21 between the adjacent first single crystal silicon layers 24 are exposed. The single crystal silicon layer 24 becomes the body pillar 24A disposed between the head pillar 25B and the silicon substrate 21. Further, after the sacrificial layer pattern 22 is completely removed, a sidewall of the pillar 100 including the body pillar 24A and the head pillar 25B is exposed. Here, the body pillar 24A of the pillar 100 serves as a channel region of a vertical channel transistor.

The body pillar 24A is surrounded by a gate electrode to be formed later. Herein, a gate dielectric layer is formed between the body pillar 24A and the gate electrode, and it will be described hereinafter. Furthermore, the head pillar 25B is connected to a storage node to be formed later. The body pillar 24A has a height ranging from approximately 2,000 Å to approximately 3,000 Å because the sacrificial layer has a thickness ranging from approximately 2,000 Å to approximately 3,000 Å.

Figure 2G:
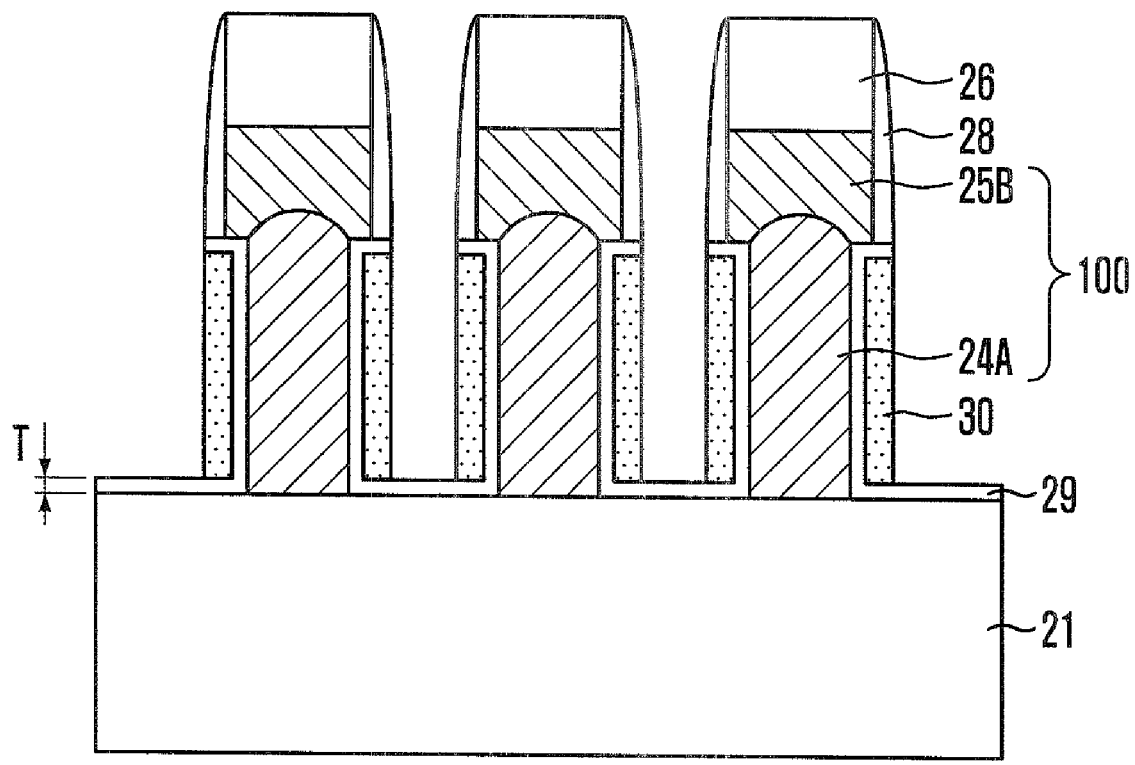

Referring to FIG. 2G, a gate dielectric layer 29 is formed on exposed surfaces of the body pillar 24A and the silicon substrate 21. The gate dielectric layer 29 may include a silicon oxide layer. The gate dielectric layer 29 may be formed to approximately 50 Å thick through deposition or oxidation process. The gate dielectric layer 29 may have different thickness. For example, the gate dielectric layer 29 formed on the substrate 21 with the ion implanted region has the thickness greater than that on the exposed surfaces of the body pillar 24A.

A surround type gate electrode 30 is formed to surround at least a portion of a sidewall of the body pillar 24A where the gate dielectric layer 29 is formed. That is, the gate electrode 30 surrounds at least a portion of the gate dielectric layer 29 formed on the exposed sidewall of the pillar 100. A remaining portion of the body pillar 24A which is not surrounded by the gate electrode 30 is denoted as T of FIG. 2G. In detail, the gate electrode 30 is obtained by forming a conductive layer over the silicon substrate 21, and then performing the etchback on the conductive layer until the gate dielectric layer 29 on the silicon substrate 21 between the pillars 100 is exposed. The gate electrode 30 may be formed of polysilicon doped with n-type impurity or p-type impurity. Although not shown, processes of forming a bit line and a word line may be further performed.

As described above, in accordance with the disclosed embodiments, a pillar is formed by forming a contact hole, growing a single crystal silicon layer, and removing a sacrificial layer in sequence. Accordingly, it is possible to stably form the pillars with uniform diameters in any state of Within-Wafer (WIW), Wafer-to-Wafer (WTW), and Lot-to-Lot (LTL).

Also, it is unnecessary to perform a lateral etch for forming a body pillar, thus facilitating the pillar forming process. Consequently, it is possible to improve the reliability of the vertical channel transistor.

It will be apparent to those skilled in the art that various changes and modifications may be made without departing from the spirit and scope of the invention as defined in the following claims.

What is claimed is:

1. A method for fabricating a semiconductor device, the method comprising:
    forming a sacrificial layer over a substrate;
    forming a contact hole in the sacrificial layer;
    forming a pillar, said pillar filling the contact hole and extending above a top surface of the sacrificial layer;
    removing the sacrificial layer;
    forming a gate dielectric layer over an exposed sidewall of the pillar and an exposed portion of the substrate; and
    forming a gate electrode over the gate dielectric layer, wherein
    the gate electrode surrounds at least a portion of the gate dielectric layer formed on the exposed sidewall of the pillar.

2. The method of claim 1, wherein the pillar is formed of single crystalline silicon through an epitaxial growth.

3. The method of claim 2, wherein the forming of the pillar comprises:
    growing a first single crystalline silicon layer to fill the contact hole;
    laterally growing a second single crystalline silicon layer above the top surface of the sacrificial layer and over the first single crystalline silicon layer; and
    etching a portion of the second crystalline silicon layer to form a head pillar,
    wherein the first single crystalline silicon layer filling the contact hole is a body pillar.

4. The method of claim 3, wherein the first and second single crystalline layers are grown through a solid phase epitaxy (SPE) or a selective epitaxial growth (SEG).

5. The method of claim 4, wherein the second single crystalline layer is grown using an epitaxial growth including an epitaxial lateral overgrowth (ELO).

6. The method of claim 3, wherein the head pillar is formed through an etching process using a photoresist pattern as an etch barrier, the photoresist pattern having a width wider than that of the contact hole.

7. The method of claim 3, wherein the forming of the head pillar comprises:
    forming a hard mask layer over the second single crystalline silicon layer;
    forming an anti-reflective layer over the hard mask layer;
    forming a photoresist pattern over the anti-reflective layer;
    etching the anti-reflective layer and the hard mask layer using the photoresist pattern as an etch barrier, thereby forming an anti-reflective pattern and a hard mask pattern; and
    etching the second single crystalline silicon layer using the hard mask pattern as an etch barrier.

8. The method of claim 7, wherein the hard mask layer is formed of silicon nitride ($Si_3N_4$) or silicon carbide (SiC).

9. The method of claim 3, further comprising forming a capping layer on sidewalls of the head pillar after the forming of the head pillar.

10. The method of claim 9, wherein the capping layer is formed through deposition and etchback.

11. The method of claim 10, wherein the capping layer has a monolayered structure of a nitride layer or a multi-layered structure of a nitride layer and an oxide layer.

12. The method of claim 1, wherein the sacrificial layer comprises an insulation layer.

13. The method of claim 12, wherein the insulation layer comprises at least one of an oxide layer and a nitride layer.

14. The method of claim 1, wherein the removing of the sacrificial layer is performed through wet etching.

15. A method for fabricating a pillar of a semiconductor device, the method comprising:
    forming a sacrificial layer over a substrate;
    forming a contact hole in the sacrificial layer;
    forming a body pillar, said body pillar filling the contact hole;
    forming a head pillar on the body pillar, the head pillar laterally extending on a top surface of the sacrificial layer; and
    removing the sacrificial layer,
    wherein the head pillar is formed through an etching process using a photoresist pattern as an etch barrier, the photoresist pattern having a width greater than that of the contact hole.

16. The method of claim 15, wherein the pillars are formed of single crystalline silicon through an epitaxial growth.

17. The method of claim 16, wherein the forming of the head pillar comprises:
    growing a single crystalline silicon layer for the head pillar on the body pillar;
    forming a hard mask layer over the single crystalline silicon layer;
    forming an anti-reflective layer over the hard mask layer;
    forming a photoresist pattern over the anti-reflective layer;
    etching the anti-reflective layer and the hard mask layer using the photoresist pattern as an etch barrier, thereby forming an anti-reflective pattern and a hard mask pattern; and
    etching the single crystalline silicon layer using the hard mask pattern as an etch barrier.

18. The method of claim 17, wherein the hard mask layer is formed of silicon nitride ($Si_3N_4$) or silicon carbide (SiC).

19. The method of claim 17, further comprising forming a capping layer on sidewalls of the head pillar after the forming of the head pillar.

20. The method of claim 19, wherein the capping layer is formed through deposition and etchback.

21. The method of claim 20, wherein the capping layer has a monolayered structure of a nitride layer or a multi-layered structure of a nitride layer and an oxide layer.

22. The method of claim 15, wherein the body pillar and the head pillar include a single crystalline silicon layer growing through a solid phase epitaxy (SPE) or a selective epitaxial growth (SEG).

23. The method of claim 15, wherein the sacrificial layer comprises an insulation layer.

24. The method of claim 23, wherein the insulation layer comprises at least one of an oxide layer and a nitride layer.

25. The method of claim 15, wherein the removing of the sacrificial layer is performed through wet etching.

* * * * *